(12) United States Patent
Ahn et al.

(10) Patent No.: US 11,061,070 B2
(45) Date of Patent: Jul. 13, 2021

(54) GUIDE PLATE FOR PROBE CARD AND MANUFACTURING METHOD THEREOF, AND PROBE CARD HAVING SAME

(71) Applicant: POINT ENGINEERING CO., LTD., Asan (KR)

(72) Inventors: Bum Mo Ahn, Suwon (KR); Seung Ho Park, Hwaseong (KR); Sung Hyun Byun, Hwaseong (KR)

(73) Assignee: POINT ENGINEERING CO., LTD., Asan (KR)

( * ) Notice: Subject to any disclaimer, the term of this patent is extended or adjusted under 35 U.S.C. 154(b) by 87 days.

(21) Appl. No.: 16/666,132

(22) Filed: Oct. 28, 2019

(65) Prior Publication Data
US 2020/0132756 A1    Apr. 30, 2020

(30) Foreign Application Priority Data
Oct. 29, 2018    (KR) .................. 10-2018-0130178

(51) Int. Cl.
*G01R 31/28*    (2006.01)
*G01R 3/00*    (2006.01)
*G01R 1/073*    (2006.01)

(52) U.S. Cl.
CPC ..... *G01R 31/2887* (2013.01); *G01R 1/07342* (2013.01); *G01R 3/00* (2013.01)

(58) Field of Classification Search
CPC .. G01R 1/07307; G01R 1/07385; G01R 1/36; G01R 3/00; G01R 31/2601; G01R 31/2889
See application file for complete search history.

(56) References Cited

U.S. PATENT DOCUMENTS 6,160,412 A * 12/2000 Martel ............... G01R 1/07371
324/754.07
2016/0216294 A1* 7/2016 Kaashoek .......... G01R 1/06722

FOREIGN PATENT DOCUMENTS

| JP | 2003021668 A | 1/2003 |
| KR | 101719912 B1 | 3/2017 |
| WO | WO2005083773 A1 | 9/2005 |

* cited by examiner

*Primary Examiner* — Tung X Nguyen

(57) ABSTRACT

Disclosed is a guide plate for a probe card guiding a probe pin of the probe card and a manufacturing method thereof, and the probe card having the same. Particularly, the guide plate and a manufacturing method thereof, and the probe card securing reliability of the probe card are intended to be provided, wherein probe pins are easily inserted into the guide plate, and pin insertion holes into which the probe pins are inserted are precisely formed in a small size.

9 Claims, 6 Drawing Sheets

GUIDE PLATE FOR PROBE CARD AND MANUFACTURING METHOD THEREOF, AND PROBE CARD HAVING SAME

CROSS REFERENCE TO RELATED APPLICATION

The present application claims priority to Korean Patent Application No. 10-2018-0130178, filed Oct. 29, 2018, the entire contents of which is incorporated herein for all purposes by this reference.

BACKGROUND OF THE INVENTION

Field of the Invention

The present invention relates to a guide plate for a probe card guiding a probe pin of the probe card and a manufacturing method thereof, and the probe card having the same.

Description of the Related Art

Semiconductors have been commercialized through integrated circuit (IC) design, manufacturing processes, inspections, and packaging, and in recent years, inspection processes have become more important due to high integration of semiconductors.

Inspection of semiconductors can be divided into verifying operation at a die level and reliability at a packaging level. A probe card having probe pins is used to perform the inspection process at the die level.

The probe card is a device that connects a semiconductor wafer (or a semiconductor device) with inspection equipment so as to inspect the operation of a semiconductor device. The probe card sends electricity to a wafer while bringing the probe pins provided in the probe card into contact with the wafer and functions to sort out bad semiconductor chips according to incoming signals at that time.

In this case, the probe pins are inserted into pin insertion holes formed in a guide plate for a probe card to be guided.

Such a guide plate for a probe card is disclosed in Korean Patent No. 10-1719912 (hereinbelow, referred to as "patent document 1").

In a ceramic guide plate for the probe card of patent document 1, a plurality of green sheets are laminated and pressed to form a green bar, and through holes into which the probe pins are inserted are formed in the green bar by laser irradiation on one surface of the green bar.

However, the ceramic guide plate of ceramic materials has low transmittance, which makes insertion of the probe pins difficult. Accordingly, manufacturing time and cost of the probe card increases.

In addition, large opening areas are formed in the irradiated surface, and thus the through holes formed by the irradiation have inclinations.

That is, each of the through holes does not have a vertically penetrated hole shape, but has an inclined hole shape having a larger area at any one part of an upper part or a lower part thereof.

Due to the shape of the through holes, when the probe pins contact with the semiconductor wafer (or the semiconductor device), the probe pins may shake. Accordingly, a position of each of the probe pins is changed and thus reliability of the probe card is lowered.

In addition, the green bar may be deformed by heat produced by the irradiation. Accordingly, the plurality of through holes cannot be formed precisely.

Furthermore, since the laser irradiation takes a lot of time and is very expensive, manufacturing time and cost of the probe card increases.

As for the conventional art described in the related art of patent document 1, a method of mechanically drilling the through holes in a ceramic guide plate by using a CNC machine also has difficulty in precisely forming the through holes. Furthermore, when the probe pins are miniaturized according to the size of a highly integrated semiconductor device, it is difficult to form small through holes corresponding to the miniaturized probe pins.

DOCUMENTS OF RELATED ART (Patent document 1) Korean Patent No. 10-1719912;
(Patent document 2) International Patent Publication No. WO2005/083773; and
(Patent document 3) Japanese Patent Application Publication No. 2003-21668.

SUMMARY OF THE INVENTION

Accordingly, the present invention has been made keeping in mind the above problems occurring in the related art, and the present invention is intended to propose a guide plate and a manufacturing method thereof, and a probe card securing reliability of the probe card, wherein probe pins are easily inserted into the guide plate, and pin insertion holes into which the probe pins are inserted are precisely formed in a small size.

In order to achieve the above objectives, according to one aspect of the present invention, there is provided a guide plate for a probe card guiding probe pins of the probe card, the guide plate including: anodized films formed by removing a metal after anodizing the metal, and a plurality of pin insertion holes formed through an upper surface and a lower surface of each of the anodized films such that the probe pins are inserted thereinto, wherein each of the plurality of pin insertion holes is formed by etching the anodized films to have a width larger than a width of each of pores formed during the anodizing.

In addition, the guide plate for a probe card may be provided by laminating the anodized films in plural.

Furthermore, the plurality of anodized films may be vertically bonded to each other by an adhesive film placed between the plurality of anodized films, wherein the adhesive film may have through holes formed in areas corresponding to the plurality of pin insertion holes and bonds non-hole areas, which do not have the plurality of pin insertion holes in the plurality of anodized films, to each other.

A manufacturing method of a guide plate for a probe card guiding probe pins of the probe card according to the aspect of the present invention, the method including: anodizing the metal which is a basic material; removing of the basic material in which the metal is removed from the anodized metal to make anodized films; and etching the anodized films to form a plurality of pin insertion holes into which the probe pins are inserted, each of the pin insertion holes having a width larger than a width of each of pores formed during the anodizing and formed through an upper surface and a lower surface of each of the anodized films.

In addition, the method of the present invention may further include: laminating the plurality of anodized films by vertically laminating the anodized films in plural formed during the removing of the basic material after the etching and by placing an adhesive film between the plurality of anodized films to vertically bond the plurality of anodized films to each other, wherein the plurality of anodized films are bonded to each other by being arranged such that the plurality of pin insertion holes formed in each of the plurality of anodized films vertically correspond to each other; and removing of the adhesive film by laser irradiation on the plurality of pin insertion holes of the plurality of anodized films laminated vertically.

Furthermore, the method of the present invention may further include: laminating of the anodized films by bonding non-hole areas without the plurality of pin insertion holes in the plurality of anodized films to each other by an adhesive film in such a manner that the anodized films formed in the removing of the basic material after the etching are vertically laminated in plural, and the plurality of anodized films are vertically bonded to each other by placing the adhesive film between the plurality of anodized films, wherein the plurality of anodized films are laminated by being arranged such that the plurality of pin insertion holes formed in each of the plurality of anodized films vertically correspond to each other, and the adhesive film has through holes in areas corresponding to the plurality of pin insertion holes.

The probe card according to the aspect of the present invention includes: a first guide plate having a plurality of first pin insertion holes formed through an upper surface and a lower surface thereof; a second guide plate positioned under the first guide plate to be vertically spaced apart therefrom and having a plurality of second pin insertion holes formed through an upper surface and a lower surface thereof; and a plurality of probe pins, a first end of each of which is inserted into each of the plurality of first pin insertion holes to be guided, and a second end of each of which is inserted into each of the plurality of second pin insertion holes to be guided, wherein at least one guide plate of the first and second guide plates is composed of anodized films formed by removing the metal after anodizing the metal, and each of the plurality of first pin insertion holes or second pin insertion holes of the any one guide plate is provided by etching each of the anodized films to have a width larger than a width of each of pores formed during the anodizing.

In addition, the one guide plate may be provided by laminating the anodized film in plural.

Furthermore, the probe card may further include: support parts placed between the first and second guide plates and having a penetration section defined between the support parts, wherein a size of the plurality of first or second pin insertion holes formed in each of the first and second guide plates may be smaller than or the same as a size of the penetration section, and elastic parts of the probe pins may be positioned in the penetration section.

As described above, the guide plate for a probe card and the manufacturing method thereof, and the probe card having the same according to the present invention have the following effects.

The guide plate of the present invention has higher transmittance than a conventional guide plate of a ceramic material. Accordingly, the insertion of the probe pins is very easily performed, and thus the manufacturing of the probe card is very easy and a problem of poor insertion of the probe pins can be solved.

Since pin insertion holes of the guide plate for a probe card, into which the probe pins are inserted later, are identified by naked eye, the probe pins can be inserted into the pin insertion holes in an automated process by using equipment having a vision sensor.

During contact with semiconductor terminals, each of the probe pins in the guide plate of the present invention has less shaking than each of probe pins in the conventional guide plate. Accordingly, precise inspection of the semiconductor wafer can be performed.

Unlike pin insertion holes formed by conventional laser processing, the pin insertion holes of the present invention are prevented from being deformed by heat and are formed precisely.

Each of the pin insertion holes of the guide plate of the present invention has a size smaller than a size of each of pin insertion holes formed by conventional machine drilling and is more precisely formed.

Each of the pin insertion holes can have a variety of shapes such as a polygon and accordingly, the probe pins having various shapes can be inserted into the pin insertion holes.

The plurality of anodized films are manufactured by being vertically laminated, and thus the thickness of the anodized films guiding the probe pins can be easily controlled.

During contact with the semiconductor wafer, the probe pins in the probe card of the present invention maintain less shaking than probe pins in a conventional probe card. Accordingly, a second end of the probe pin can be efficiently prevented from contacting with a semiconductor terminal which is not targeted due to the shaking. Therefore, high reliability of the probe card is guaranteed.

The probe card of the present invention can effectively inspect an integrated semiconductor device (or a semiconductor wafer) than the conventional probe card.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Figure 1:
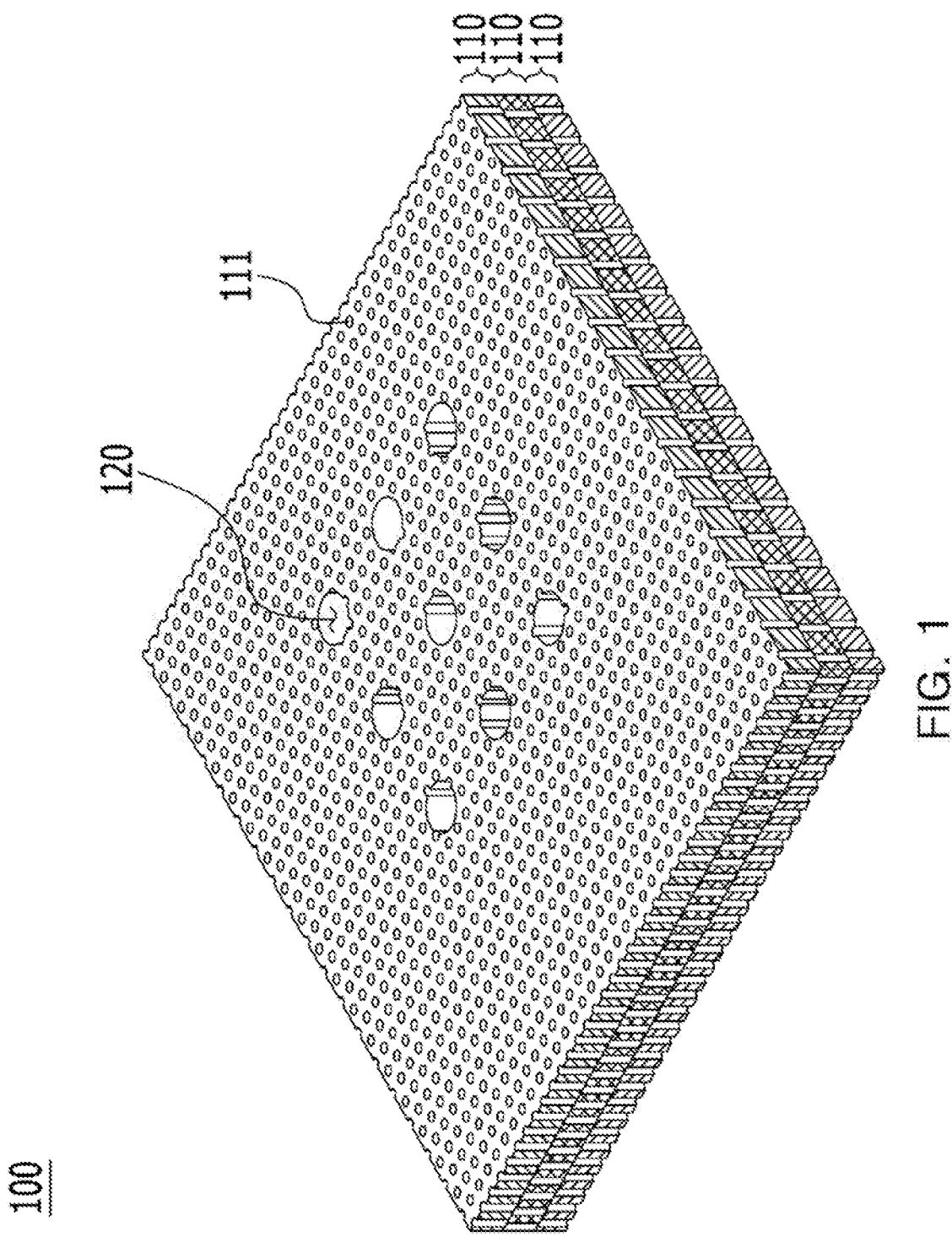
FIG. 1 is a perspective view of a guide plate for a probe card according to a first embodiment of the present invention.

Hereinbelow, exemplary embodiments of the present invention will be described in detail with reference to the accompanying drawings. Throughout the drawings, the same reference numerals will refer to the same or like parts.

The following merely illustrates the principles of the invention. Therefore, those skilled in the art will be able to embody the principles of the invention and invent various apparatuses included in the concept and scope of the invention, although not explicitly described or illustrated herein. In addition, it is to be understood that all conditional terms and the embodiments listed in this specification are, in principle, only expressly intended for the purpose of understanding the concept of the invention and are not limited to the embodiments and states so specifically listed.

The above objects, features and advantages will become more apparent from the following detailed description taken in conjunction with the accompanying drawings, whereby the embodiments of the present invention may be easily implemented by those skilled in the art to which the present invention pertains.

The embodiments described herein will be described with reference to a sectional view and/or a perspective view, which are ideal exemplary views of the present invention.

Accordingly, the embodiments of the present invention are not limited to specific forms shown, but also include changes in forms generated according to manufacturing processes.

A Guide Plate 100 for a Probe Card According to a First Embodiment of the Present Invention.

Hereinbelow, the guide plate 100 for a probe card according to the first embodiment of the present invention will be described referring to FIGS. 1 and 2.

Figure 2:
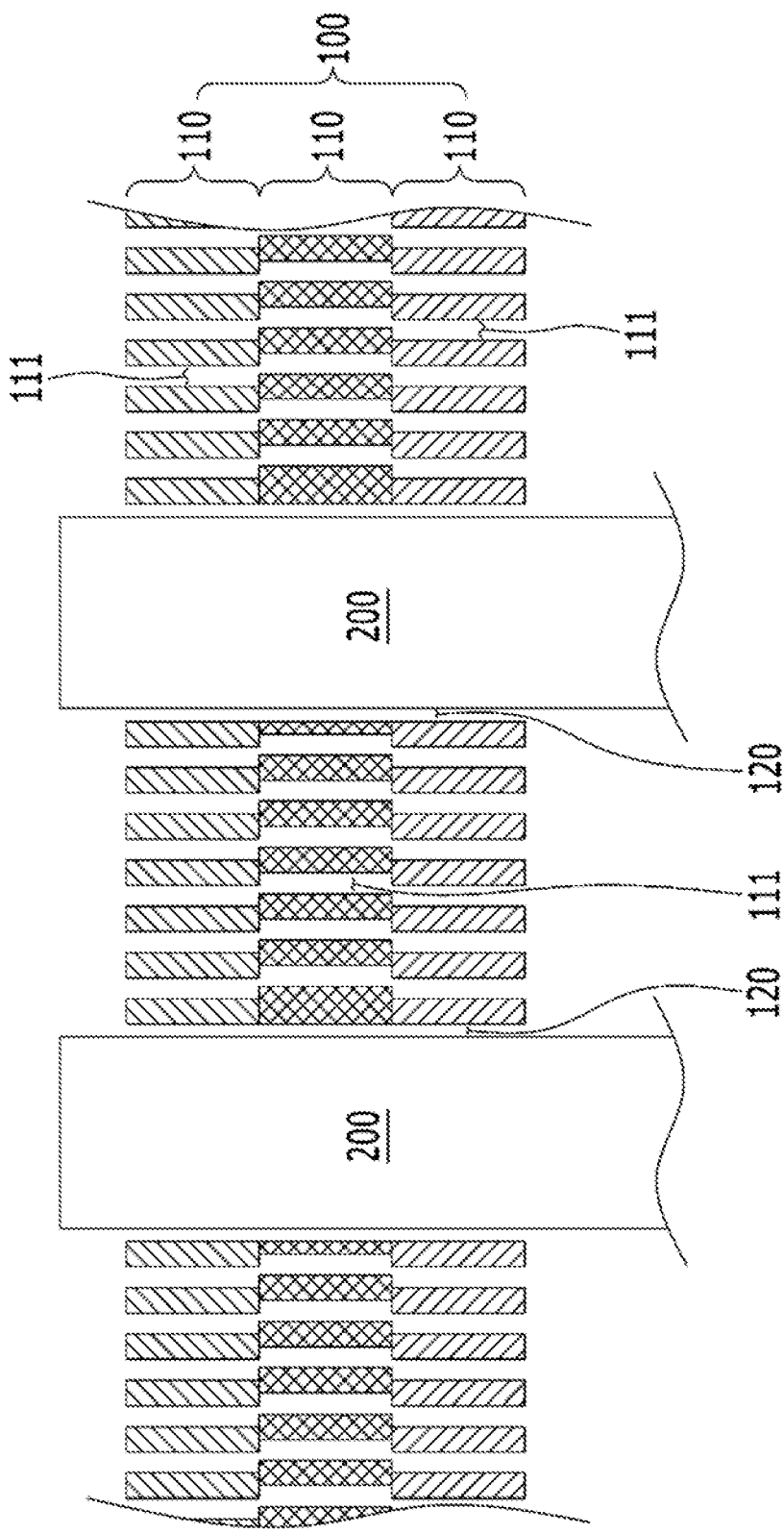
FIG. 2 is a sectional view of the guide plate for a probe card of FIG. 1, into which probe pins are inserted.

FIG. 1 is a perspective view of a guide plate for a probe card according to the first embodiment of the present invention, and FIG. 2 is a sectional view of the guide plate for a probe card of FIG. 1, into which probe pins are inserted.

As illustrated in FIGS. 1 and 2, the guide plate 100 for a probe card according to the first embodiment of the present invention may include: anodized films 110 formed by removing a metal after anodizing the metal; pores 111 formed in the anodized films 110 during anodizing the metal; and a plurality of pin insertion holes 120 formed through an upper surface and a lower surface of each of the anodized films 110 such that the probe pins 200 are inserted thereinto.

The guide plate 100 for a probe card functions to guide the probe pins 200 of the probe card 10.

The guide plate 100 for a probe card is composed of the anodized films 110 formed by removing a metal after anodizing the metal.

The anodized films 110 are formed by removing the metal after anodizing the metal, and this will be described in detail hereinafter.

The plurality of anodized films 110 constituting the guide plate 100 for a probe card may be bonded to each other by being vertically laminated, and for an example, FIGS. 1 and 2 illustrate three anodized films 110 laminated vertically.

The pores 111 are naturally formed in the anodized films 110 during anodizing. In other words, the pores 111 is formed during the anodizing of a metal, and this will be described in detail hereinafter.

The pores 111 are formed through at least any one surface of the upper surface and the lower surface of the anodized film 110, and each of a plurality of pores is regularly formed in the anodized films 110 to have a predetermined width.

The width of each of the pores 111 is tens to hundreds micrometers or less.

The guide plate 100 for a probe card includes the plurality of pin insertion holes 120 formed through the upper surface and the lower surface of the anodized film 110 such that the probe pins 200 are inserted thereinto.

The plurality of pin insertion holes are formed by etching the anodized films 110.

In this case, the plurality of pin insertion holes are preferably formed in a middle area of each of the anodized films 110, which is a middle area of the guide plate 100 for a probe card, that is, only in some portions of the anodized film.

Figure 5:
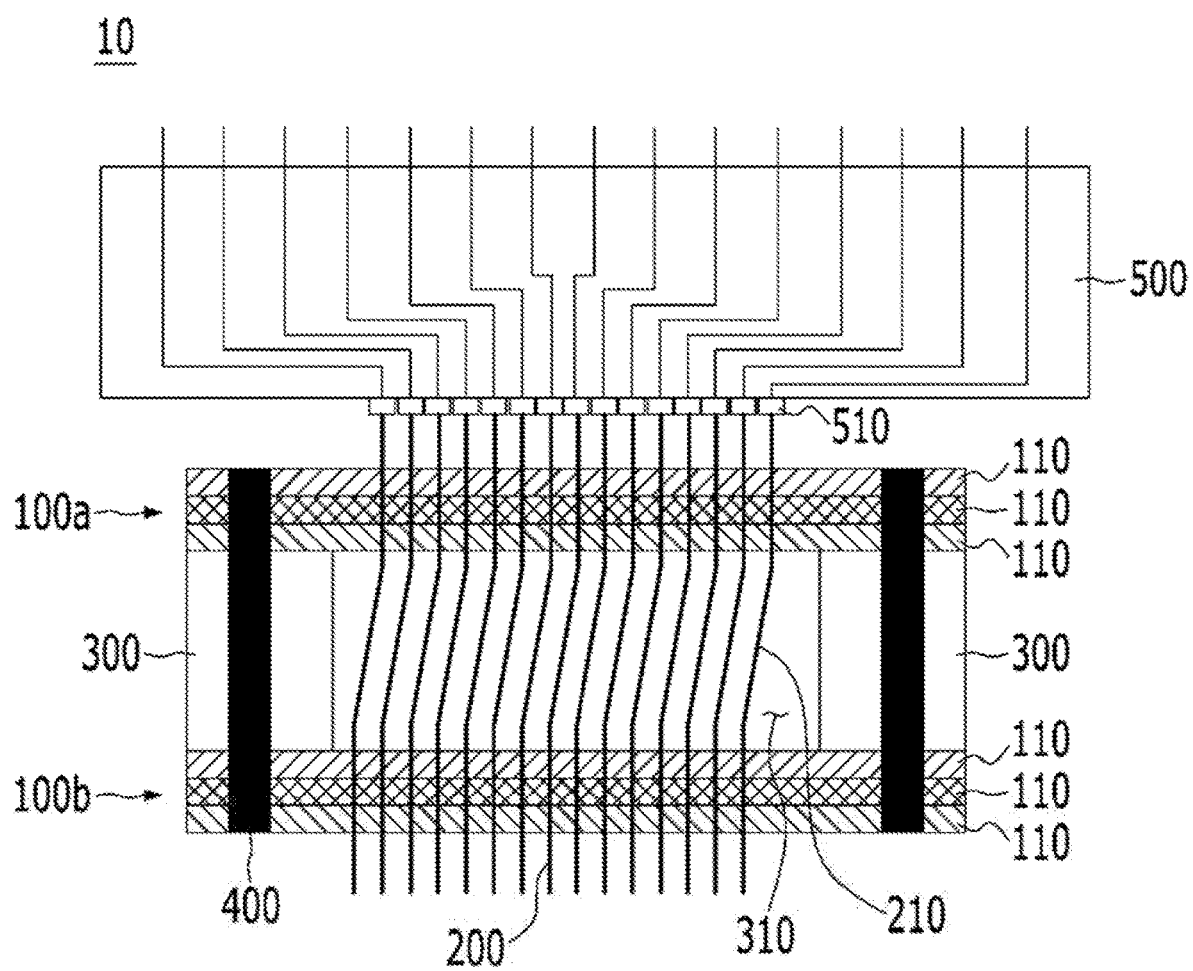
FIG. 5 is a sectional view of the probe card according to the first embodiment of the present invention.
Figure 6:
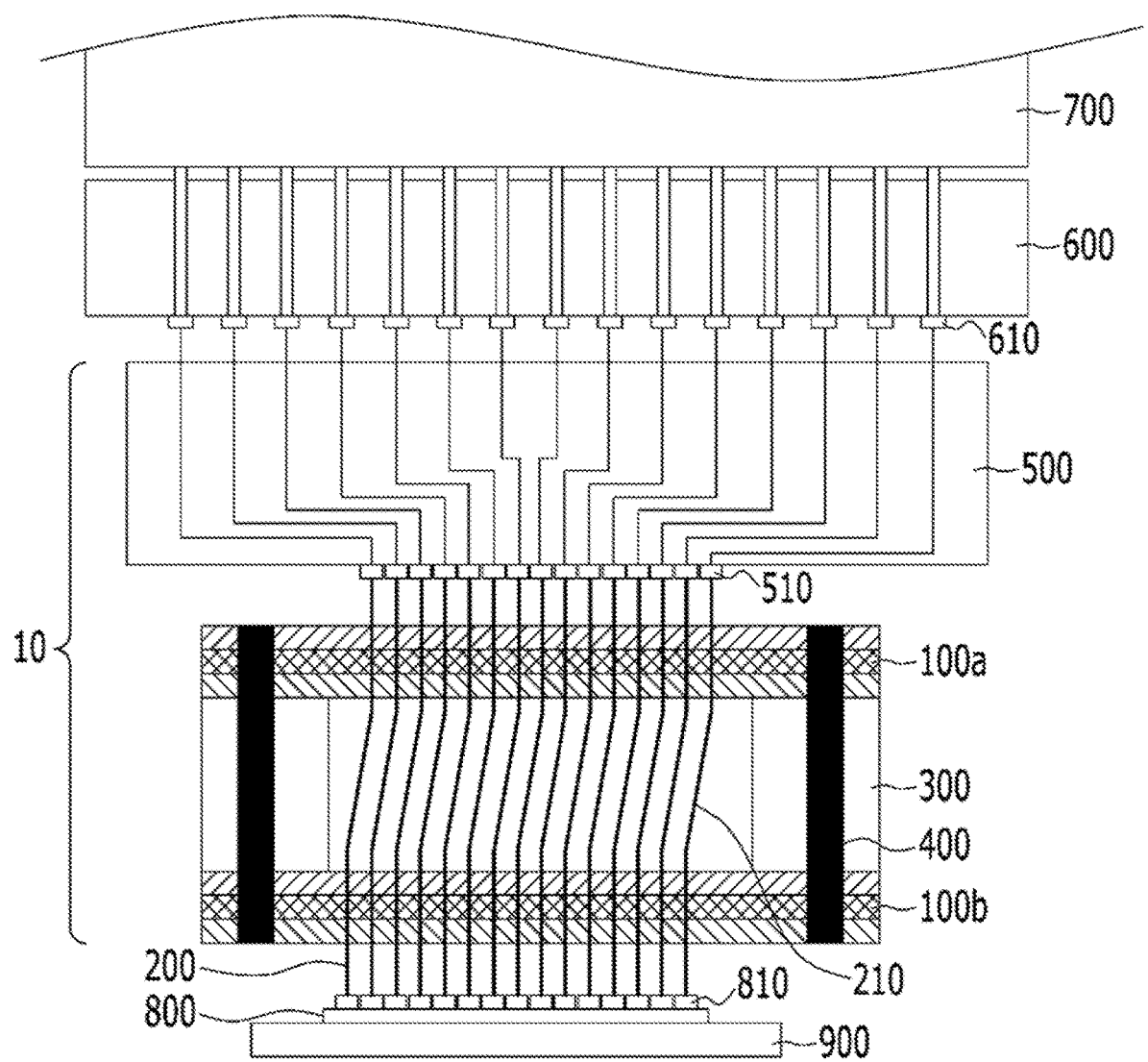
FIG. 6 is a view of the probe card of FIG. 5, which is connected to inspection equipment.

This is because during manufacturing of the probe card 10, the probe pins 200 are preferably arranged at a middle area of a space vertically defined in the guide plate 100 for a probe card (between first and second guide plates 100a and 100b of FIGS. 5 and 6). (In FIGS. 5 and 6, the plurality of probe pins 200 are arranged in a penetration section 310.)

The width of each of such pin insertion holes 120 is preferably formed to have a size of several hundred micrometers or less (preferably, 100 µm).

Accordingly, the width of each of the plurality of pin insertion holes 120 is formed to have a width larger than a width of each of the pores 111 formed during the anodizing.

Each of the plurality of probe pins 200 is inserted into each of the plurality of pin insertion holes 120 formed as described above to be guided.

In this case, as for a first guide plate 100a of the probe card 10 of the present invention described hereinafter, which is the guide plate 100 for a probe card positioned at an upper part of the probe card 10, as illustrated in FIGS. 5 and 6, a first end of each of the plurality of probe pins 200 is inserted into each of a plurality of first pin insertion holes of the first guide plate to be guided.

In addition, as for a second guide plate 100b of the probe card 10 of the present invention described hereinafter, which is the guide plate 100 for a probe card positioned at a lower part of the probe card 10, a second end of each of the plurality of probe pins 200 is inserted into each of a plurality of second pin insertion holes of the second guide plate to be guided.

A Manufacturing Method of the Guide Plate 100 for a Probe Card According to the First Embodiment of the Present Invention.

Hereinbelow, the manufacturing method of the above-described guide plate 100 for a probe card according to the first embodiment of the present invention will be described referring to FIG. 3.

Figure 3:
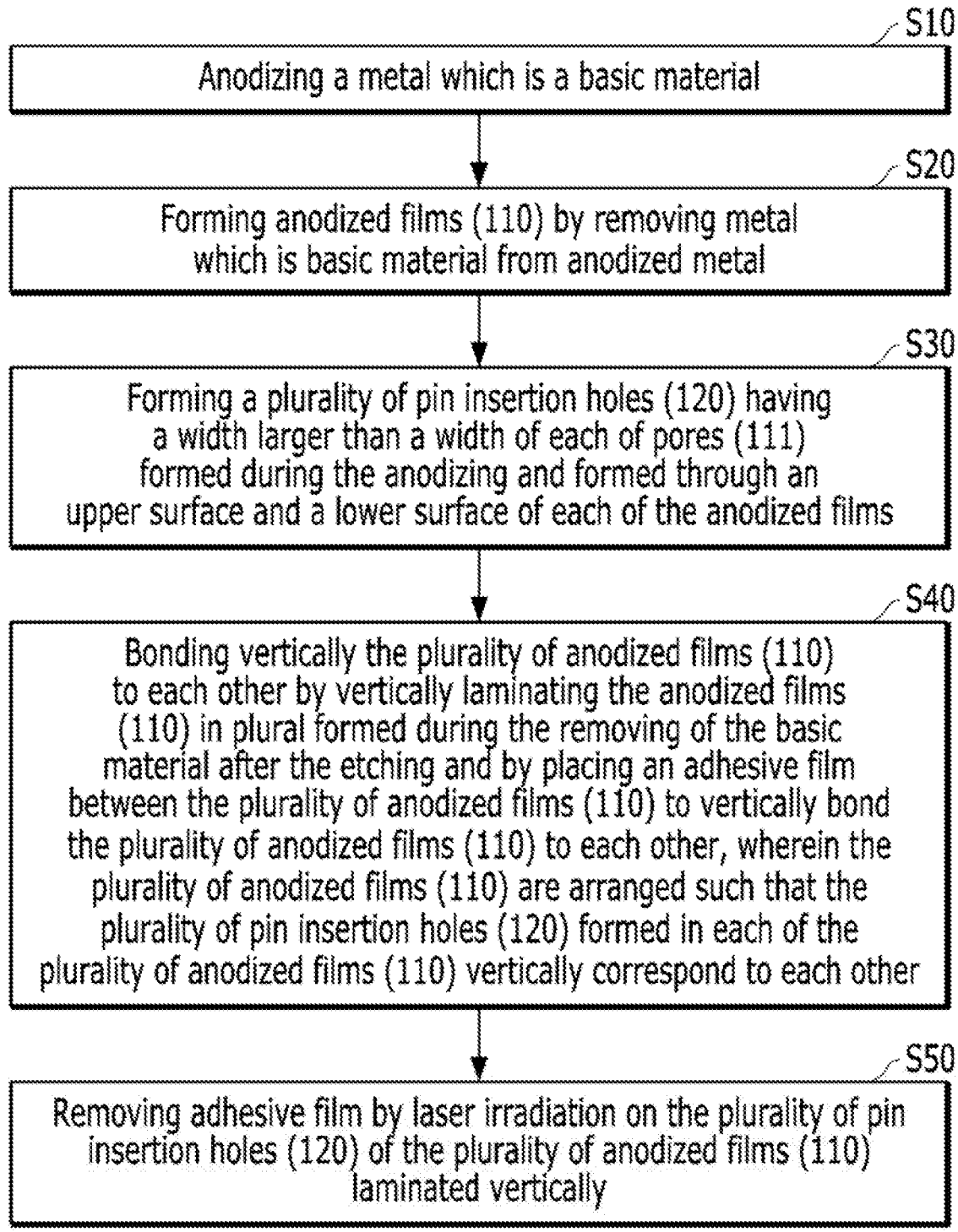
FIG. 3 is a flowchart of a manufacturing method of the guide plate for a probe card according to the first embodiment of the present invention.

FIG. 3 is a flowchart of the manufacturing method of the guide plate for a probe card according to the first embodiment of the present invention.

As illustrated in FIG. 3, the manufacturing method of the guide plate 100 for a probe card according to the first embodiment of the present invention may include: anodizing S10 of a metal which is a basic material; removing S20 of the basic material in which the metal is removed from the anodized metal to make anodized films 110; and etching S30 of the anodized films to form a plurality of pin insertion holes into which the probe pins are inserted, each of the pin insertion holes 120 having a width larger than a width of each of pores 111 formed during the anodizing and formed through an upper surface and a lower surface of each of the anodized films 110; laminating S40 of the plurality of anodized films 110 by vertically laminating the anodized films in plural formed during the removing of the basic material after the etching and by placing an adhesive film between the plurality of anodized films to vertically bond the plurality of anodized films 110 to each other, wherein the plurality of anodized films 110 are bonded to each other by being arranged such that the plurality of pin insertion holes 120 formed in each of the plurality of anodized films 110 vertically correspond to each other; and removing S50 of the adhesive film by laser irradiation on the plurality of pin insertion holes 120 of the plurality of anodized films 110 laminated vertically.

First, in the anodizing S10, a process of anodizing a metal which is the basic material is performed.

When the metal is anodized, the anodized films 110 are formed in a surface of the metal.

In addition, during the anodization of the metal, the pores 111 are formed in the anodized films 110.

For example, when the metal which is the basic material is aluminum or an aluminum alloy, the basic material is anodized and the anodized films 110 of the anodized aluminum ($Al_2O_3$) material are formed on the surface of the basic material.

During the anodization of the metal as described above, the anodized films 110 includes a barrier layer which does not have the pores 111 formed in the anodized films 110 and a porous layer having the plurality of pores 111 formed therein.

That is, the barrier layer is first formed on an upper part of the basic material which is a surface of the metal which is the basic material, and the porous layer is formed on an upper part of the barrier layer.

Each of the multiple pores 111 constituting the porous layer has a constant width of tens to hundreds of nm or less and is formed to be arranged regularly.

After the performance of the anodizing S10 is completed, the removing S20 of the basic material is performed.

In the removing of the basic material at S20, a process of forming the anodized films 110 alone by removing the metal, which is the basic material, from the anodized metal is performed.

In the removing S20 of the basic material, only the anodized films 110 are formed by removing the metal which is the basic material from the anodized metal.

For example, when the metal which is the basic material is the aluminum or aluminum alloy, the aluminum or aluminum alloy is removed from the anodized aluminum or aluminum alloy. Accordingly, when the metal which is the basic material is removed from the anodized metal, only the metal which is the basic material is removed from the metal including the anodized films 110 having the barrier layer and the porous layer formed on the surface of the metal, and accordingly, only the anodized films 110 of anodized aluminum ($Al_2O_3$) material remain.

A thickness of the anodized films 110 from which the metal is removed may have a size of 90 to 120 μm.

In the removing S20 of the basic material, the barrier layer of the anodized films 110 as well as the metal which is the basic material may be removed, and when the barrier layer is removed, only the porous layer remains as illustrated in FIGS. 1 and 2. Accordingly, the pores 111 formed through the upper surface and the lower surface of the anodized film 110 are provided.

As described above, as for the anodized films 110 from which even the barrier layer is removed, the pores 111 are formed through the upper surface and the lower surface of the anodized film 110. Accordingly, during the vertical lamination of the plurality of anodized films 110, each of the plurality of pores 111 functions as an anchor and thus the adhesive film is more securely bonded between the plurality of anodized films 110.

Furthermore, even when a liquid adhesive is used, the liquid adhesive may penetrate the plurality of pores 111 to facilitate the bonding of the upper surface and the lower surface of each of the plurality of anodized films 110.

The anodized films 110 described above preferably has transmittance to the degree that the pin insertion holes 120 of the guide plate 100 for a probe card located at different positions are seen by naked eye.

For example, when a metal which is the basic material is aluminum or aluminum alloy, a material of the anodized films 110 is anodized aluminum ($Al_2O_3$), and the transmittance of the anodized films 110 has high transmittance of 80% or more.

After the performance of the removing S20 of the basic material is completed, the etching S30 is performed.

In the etching S30, a process of forming the plurality of pin insertion holes 120 by etching the anodized films 110 is performed such that the probe pins 200 are inserted thereinto.

Each of the pin insertion holes 120 is formed by the etching to have a width larger than a width of each of the pores 111 formed during the anodizing.

In addition, the plurality of pin insertion holes 120 are preferably formed by etching a middle area of each of the anodized films 110, which refers to some portions thereof.

The pin insertion holes 120 formed by the etching are formed through the upper surface and the lower surface of the anodized film 110.

Each of the plurality of pin insertion holes 120 formed by the etching may have a circular shape as illustrated in FIG. 1, and have a polygonal shape as needed.

Accordingly, even when each of the plurality of pin insertion holes 120 has a polygonal shape, the width of the pin insertion hole 120 (in this case, the width is a size of the longest line that passes through a center point of a polygon from any one vertex thereof) preferably has a size of several hundred micrometers or less (preferably, 100 μm).

After the performance of the etching S30 is completed, the laminating S40 is performed.

In the laminating S40, a process of bonding the anodized films to each other by vertically laminating the anodized films 110 in plural formed by removing the metal in the removing S20 of the basic material is performed.

First, the plurality of anodized films 110 are provided by repeatedly performing the anodizing S10 and the removing S20 of the basic material. In this case, each of the plurality of anodized films preferably has the same size and thickness, and has the plurality of pin insertion holes 120 formed in the same positions.

After the adhesive film is placed between the plurality of anodized films 110 arranged as described above (between the upper surface and the lower surface of each of the plurality of anodized films 110), the plurality of anodized films 110 are vertically laminated.

The adhesive film may have an epoxy-based or polymer-based material, preferably having a size of 10 μm or less.

In addition, the adhesive film is preferably made of a transparent material. Accordingly, although the guide plate 100 for a probe card has the anodized films 110 formed by being vertically laminated in plural, the guide plate may have the transmittance to a degree that the pin insertion holes 120 of the guide plate 100 for a probe card located at different portions are seen by naked eye.

For example, in FIG. 1, the guide plate 100 for a probe card includes three anodized films 110 laminated vertically. In this case, each of the anodized films 110 has a thickness of 90 to 120 μm, and each of two adhesive film layers is placed between the anodized films. Accordingly, the thickness of the anodized films 110 laminated in three layers, i.e. the thickness of the guide plate 100 for a probe card, is 290 to 380 μm.

When the guide plate 100 for a probe card has two anodized films 110 laminated vertically, thickness of the guide plate 100 for a probe card may be 190 to 250 μm.

As described above, when the adhesive film is placed between the plurality of anodized films 110, the plurality of anodized films 110 are bonded to each other by arranging the plurality of pin insertion holes 120 such that the plurality of pin insertion holes 120 formed in each of the plurality of anodized films 110 correspond vertically to each other.

As for the arrangement described above, each of the plurality of anodized films 110 has the same size and thickness and has the plurality of pin insertion holes 120 formed in the same positions, and the plurality of pin insertion holes 120 are formed by the etching. Accordingly, the pin insertion holes are formed easily.

To describe in detail, when the plurality of pin insertion holes 120 are formed by etching, the etching is performed after masking the anodized films 110. In this case, the plurality of pin insertion holes 120 are formed in the same positions of each of the plurality of anodized films 110.

In addition, each of the plurality of anodized films 110 has the same size, and when the plurality of anodized films 110 are laminated vertically, edges of each of the anodized films 110 are arranged, and accordingly, the arrangement described above is easily performed.

For the arrangement described above, the adhesive film preferably has the same size as the size of each of the plurality of anodized films 110.

Unlike the above description, the bonding of the plurality of anodized films 110 may be achieved by applying an epoxy-based or polymer-based liquid adhesive to the upper and lower surfaces of each of the plurality of anodized films 110.

In this case, the liquid adhesive is preferably made of a transparent material and accordingly, high transmittance of the guide plate 100 for a probe card can be maintained.

After the performance of the laminating S30 is completed, the removing S50 of the adhesive film is performed.

In the removing S50 of the adhesive film, a process of removing the adhesive film positioned in the pin insertion holes 120 is performed by laser irradiation on the plurality of pin insertion holes 120 of the anodized films 110 laminated vertically.

As described above, as the adhesive film positioned in the pin insertion holes 120 is removed, each of the plurality of pin insertion holes 120 of the plurality of anodized films 110 has a shape formed through the upper surface and the lower surface of the guide plate 100 for a probe card, which is composed of the plurality of anodized films 110.

In this case, the plurality of anodized films 110 may be arranged such that the pores 111 of the plurality of upper anodized films 110 do not vertically correspond to each other. However, the plurality of anodized films 110 are configured such that the plurality of pin insertion holes 120 correspond to each other in vertical directions of the plurality of anodized films 110 and are perpendicular to the upper surface and the lower surface of each of the plurality of anodized films 120.

Only the adhesive film positioned in the pin insertion holes 120 is removed by the laser irradiation performed in the removing S50 of the adhesive film, and since the adhesive film has a relatively small thickness, the removal of the adhesive film is rapidly performed.

In addition, since only the adhesive film positioned in the pin insertion holes 120 is removed, the plurality of pin insertion holes 120 themselves are not required to be melted. Accordingly, each of the plurality of pin insertion holes 120 can maintain a shape perpendicular to the upper surface and the lower surface of each of the plurality of anodized films 120.

As the performance of the removing S50 of the adhesive film is completed, the manufacturing of the guide plate 100 for a probe card is completed as illustrated in FIG. 1.

The guide plate 100 for a probe card having the configuration described above according to the first embodiment of the present invention has the following effects.

The guide plate 100 for a probe card of the present invention has higher transmittance than the conventional guide plate of a ceramic material. Accordingly, the insertion of the probe pins 200 is easily performed, and thus a problem of poor insertion of the probe pins can be solved.

To describe in detail, the probe pins 200 are inserted into the pin insertion holes 120 of the guide plate 100 for a probe card, wherein the guide plate has a space vertically defined therein. Since the conventional guide plate of a ceramic material has low transmittance, it is difficult to identify by naked eye the pin insertion holes of the guide plate into which the probe pins are inserted later. Accordingly, when the probe pins are manually inserted into the pin insertion holes, the insertion of the probe pins is very difficult. Accordingly, poor insertion of the probe pins occurs and the insertion thereof takes much time.

However, since the guide plate 100 for a probe card of the present invention is composed of the anodized films 110 of a high transmittance material, the pin insertion holes 120 of the guide plate 100 for a probe card into which the probe pins 200 are inserted later are seen by naked eye. Accordingly, the insertion of the probe pins 200 is very easy.

Particularly, when cobra pins are provided as the probe pins 200 and each of the cobra pins having a first end and a second end, which are not in the same vertical line, is inserted to a first side of the guide plate, the pin insertion holes 120 of a second side thereof are seen by naked eye. Accordingly, the insertion of the cobra pins is easy.

Furthermore, generally, the probe pins 200 are manually inserted into the pin insertion holes 120, and the pin insertion holes 120 of the guide plate 100 for a probe card, into which the probe pins 200 are inserted later, are identified by naked eye. Accordingly, the probe pins 200 will be able to be inserted into the pin insertion holes 120 in an automated process by using equipment having a vision sensor in the future.

Since the pin insertion holes 120 of the guide plate 100 for a probe card are formed by etching, the pin insertion holes without inclined surfaces can be formed through the upper surface and the lower surface of the guide plate 100 for a probe card. Accordingly, when the probe pins 200 contact with semiconductor terminals 810, the pin insertion hole of the present invention allows the probe pins to have less shaking compared to a conventional pin insertion hole having an inclined surface formed by a laser. Accordingly, precise inspection of the semiconductor wafer can be performed.

The pin insertion holes 120 of the guide plate 100 for a probe card are formed by etching and accordingly can be prevented from being deformed by heat and formed precisely unlike pin insertion holes formed by conventional laser processing.

Each of the pin insertion holes 120 of the guide plate 100 for a probe card is formed by etching and accordingly, can have a size smaller than a size of each of pin insertion holes formed by conventional machine drilling and can be more precisely formed.

In addition, the pin insertion holes 120 are formed by etching, and accordingly, although semiconductors will be highly integrated and the size of the semiconductor device will be reduced in the future, each of the pin insertion holes 120 can be made to have a smaller size for the miniaturized integrated semiconductors, and the plurality of pin insertion holes 120 can be easily formed to have compact and regular arrangement.

Since the pin insertion holes 120 of the guide plate 100 for a probe card are formed by etching, each of the pin insertion holes 120 can have a variety of shapes such as a polygon. Accordingly, the probe pins 200 having various shapes can be inserted into the pin insertion holes.

The guide plate 100 for a probe card is manufactured by vertically laminating the plurality of anodized films 110, and accordingly, the thickness of the guide plate guiding the probe pins 200 can be easily controlled.

When the guide plate 100 for a probe card is composed of only one anodized film 110, the above-described laminating S40 and the removing S50 of the adhesive film may be omitted.

A Manufacturing Method of the Guide Plate 100 for a Probe Card According to a Second Embodiment of the Present Invention.

The manufacturing method of the guide plate 100 for a probe card described above according to the first embodiment of the present invention may have the second embodiment.

Hereinbelow, the manufacturing method of the guide plate 100 for a probe card according to the second embodiment of the present invention will be described referring to FIG. 4.

Figure 4:
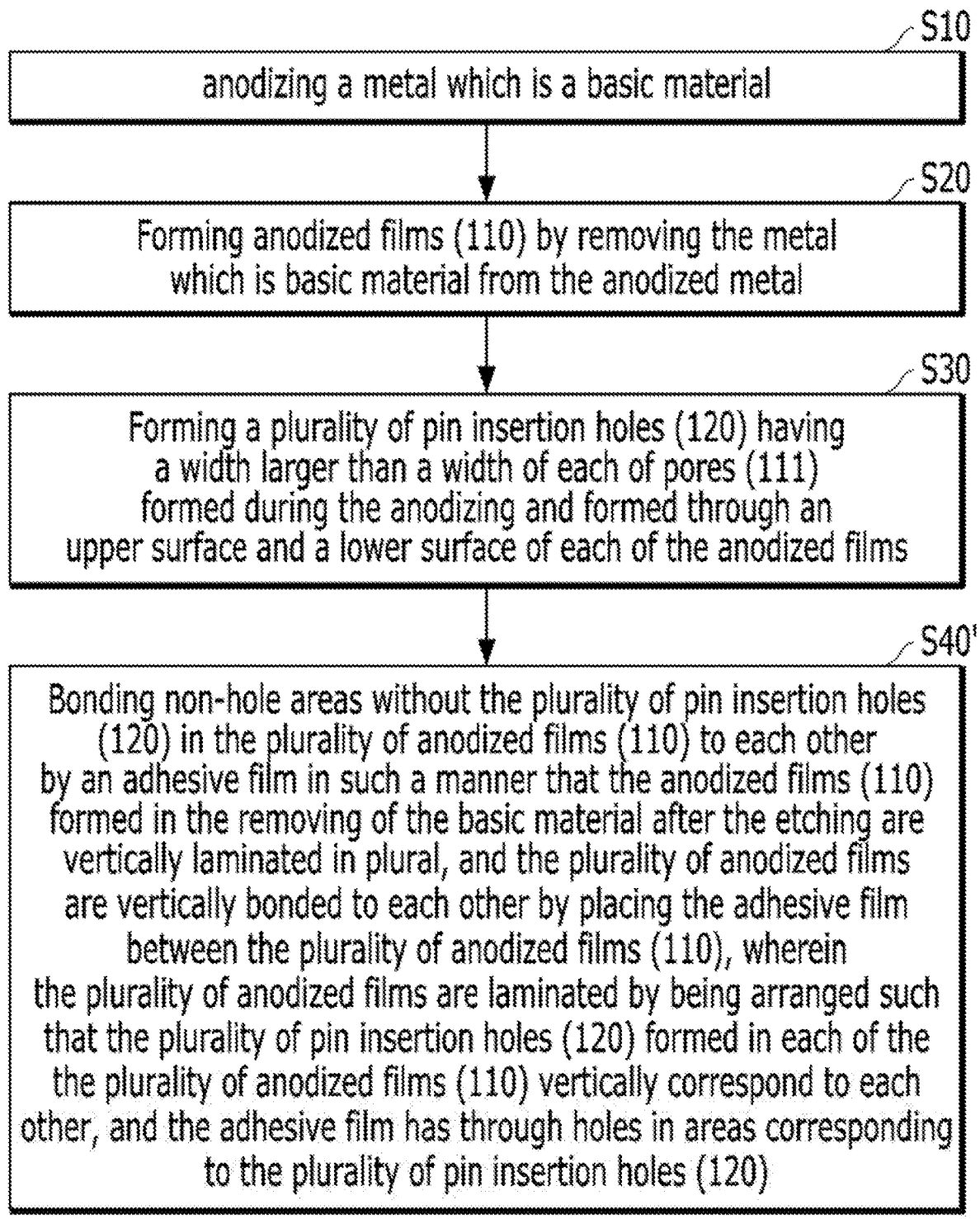
FIG. 4 is a flowchart of a manufacturing method of the guide plate for a probe card according to a second embodiment of the present invention.

FIG. 4 is a flowchart of a manufacturing method of the guide plate for a probe card according to the second embodiment of the present invention.

As illustrated in FIG. 4, the manufacturing method of the guide plate 100 for a probe card according to the second embodiment may include: anodizing S10 of a metal which is a basic material; removing S20 of the basic material in which the metal is removed from the anodized metal to make anodized films 110; and etching S30 of the anodized films to form a plurality of pin insertion holes into which the probe pins are inserted, each of the pin insertion holes 120 having a width larger than a width of each of the pores 111 formed during the anodizing and formed through an upper surface and a lower surface of each of the anodized films 110; laminating S40' of the anodized films by bonding non-hole areas without the plurality of pin insertion holes 120 in the plurality of anodized films 110 to each other by an adhesive film in such a manner that the anodized films 110 formed in the removing of the basic material after the etching are vertically laminated in plural, and the plurality of anodized films are vertically bonded to each other by placing the adhesive film between the plurality of anodized films 110, wherein the plurality of anodized films are laminated by being arranged such that the plurality of pin insertion holes 120 formed in each of the plurality of anodized films 110 vertically correspond to each other, and the adhesive film has through holes in areas corresponding to the plurality of pin insertion holes 120.

When compared to the manufacturing method of the guide plate 100 for a probe card described above according to the first embodiment of the present invention, the manufacturing method of the guide plate 100 for a probe card according to the second embodiment is different from the manufacturing method of the guide plate 100 for a probe card described above according to the first embodiment, in that the laminating S40' of the second embodiment is different from the laminating S40 and the second embodiment does not have the removing S50 of the adhesive film. However, the remainders are the same. Accordingly, description of the same steps will be omitted, and only the laminating S40' will be described hereinafter.

After the performance of the etching S30 is completed, the laminating S40' is performed.

In the laminating S40', a process of bonding the anodized films to each other by vertically laminating the anodized films 110 in plural formed by removing the metal which is the basic material in the removing S20 of the basic material is performed.

First, the plurality of anodized films 110 are provided by repeatedly performing the anodizing S10 and the removing S20 of the basic material. In this case, preferably, each of the plurality of anodized films has the same size and thickness, and has the plurality of pin insertion holes 120 formed at the same positions.

After the adhesive film is placed between the plurality of anodized films 110 provided as described above (between the upper surface and the lower surface of each of the plurality of anodized films 110), the plurality of anodized films 110 are vertically laminated.

The adhesive film may have an epoxy-based or polymer-based material, preferably having a size of 10 μm or less.

In addition, the adhesive film is preferably made of a transparent material. Accordingly, although the guide plate 100 for a probe card has the anodized films 110 formed by being vertically laminated in plural, the guide plate may have the transmittance to the degree that the pin insertion holes 120 of the guide plate 100 for a probe card located at different portions are seen by naked eye.

The adhesive film has the through holes provided at areas corresponding to areas of the plurality of pin insertion holes 120.

A size of the adhesive film is the same as a size of each of the plurality of anodized films 110.

As described above, when the adhesive film is placed between the plurality of anodized films 110, the plurality of anodized films 110 are arranged such that the plurality of pin insertion holes 120 formed in each of the plurality of anodized films 110 vertically correspond to each other and are bonded to each other. In this case, the adhesive film is arranged such that the through holes are positioned at areas corresponding to the plurality of pin insertion holes 120.

As described above, the through holes are provided in the adhesive film, and the plurality of anodized films 110 are bonded to each other by the adhesive film. Accordingly, when the plurality of anodized films 110 are bonded to each other by being vertically laminated, the adhesive film bonds the non-hole areas, which do not have the plurality of pin insertion holes 120 in the plurality of anodized films 110, to each other.

As the performance of the removing S50 of the adhesive film is completed, the manufacturing of the guide plate 100 for a probe card is completed.

In the guide plate 100 for a probe card manufactured by the manufacturing method of the guide plate 100 for a probe card according to the second embodiment, which is described above, the plurality of anodized films 110 are vertically bonded to each other by the adhesive film placed between the plurality of anodized films 110, wherein the adhesive film has the through holes provided in areas corresponding to the plurality of pin insertion holes 120, and the adhesive film bonds the non-hole areas, which do not have the plurality of pin insertion holes 120 in each of the plurality of anodized films 110, to each other.

The guide plate 100 for a probe card manufactured by the manufacturing method of the guide plate 100 for a probe card according to the second embodiment has the following effects.

The through holes are provided in the adhesive film, and only the non-hole areas which do not have the plurality of pin insertion holes 120 formed in the plurality of anodized films 110 laminated vertically are bonded to each other. Accordingly, although the above-described removing S50 of the adhesive film is not performed, each of the plurality of pin insertion holes 120 may have a shape formed through the upper surface and the lower surface of the plurality of anodized films 110. Accordingly, the manufacturing process is simplified and manufacturing efficiency increases.

The adhesive film does not exist in areas which have the plurality of pin insertion holes 120 formed in the plurality of anodized films 110 laminated vertically. Accordingly, since the guide plate 100 for a probe card can have higher transmittance, the probe pins 200 can be more easily inserted into the pin insertion holes 120.

The Probe Card 10 According to the First Embodiment of the Present Invention

Hereinbelow, the probe card 10 according to the first embodiment of the present invention will be described referring to FIGS. 5 and 6.

FIG. 5 is a sectional view of the probe card according to the first embodiment of the present invention, and FIG. 6 is a view of the probe card of FIG. 5, which is connected to inspection equipment.

The guide plate 100 for a probe card 10 having the above-described configuration according to the first embodiment of the present invention is provided.

Hereinafter, for easy description, the guide plate 100 for a probe card will be divided into the first guide plate 100a and the second guide plate 100b.

The first and second guide plates 100a and 100b constitute the same guide plate 100 for a probe card, but are divided according to positions provided in the probe card 10.

In addition, the pin insertion holes 120 formed in the first guide plate 100a are the first pin insertion holes and the pin insertion holes 120 formed in the second guide plate 100b are the second pin insertion holes.

Although not illustrated in FIGS. 5 and 6, the first and second pin insertion holes may be described by being replaced with the pin insertion holes 120 illustrated in FIGS. 1 and 2.

Furthermore, although the pores 111 are not illustrated in the first and second guide plates 100a and 100b of FIGS. 5 and 6, the pores 111 are formed in the first and second guide plates 100a and 100b.

As illustrated in FIGS. 5 and 6, the probe card 10 having the guide plate 100 for a probe card of the present invention may include: the first guide plate 100a having the plurality of first pin insertion holes formed through the upper surface and the lower surface thereof; the second guide plate 100b positioned under the first guide plate 100a to be vertically spaced apart therefrom and having the plurality of second pin insertion holes formed through the upper surface and the lower surface thereof; and the plurality of probe pins 200, the first end of each of which is inserted into each of the plurality of first pin insertion holes to be guided, and the second end of each of which is inserted into each of the plurality of second pin insertion holes to be guided; support parts 300 placed between the first and second guide plates 100a and 100b and having the penetration section 310 defined between the support parts; and a space transformer 500 compensating for difference between a pitch of the plurality of probe pins 200 and a pitch of board terminals 610 of a PCB board 600.

The first guide plate 100a functions to guide the plurality of probe pins 200 by the plurality of first pin insertion holes formed in the first guide plate 100a.

The first guide plate 100a is installed at an upper part of the support parts 300 and is positioned above the second guide plate 100b.

The first guide plate 100a includes the plurality of first pin insertion holes provided therein by being formed through the upper surface and the lower surface thereof.

The first end of each of the plurality of probe pins 200 is inserted into each of the plurality of first pin insertion holes.

Accordingly, the number of the plurality of first pin insertion holes is the same as the number of the plurality of probe pins 200 or the number of the plurality of second pin insertion holes.

When the first and second guide plates 100a and 100b, and the support parts 300 are combined with each other, the plurality of first pin insertion holes are formed in the first guide plate 100a to be positioned in an area corresponding to the penetration section 310 of the support parts 300.

Accordingly, when the first end and the second end of each of the probe pins 200 are inserted into the first and second pin insertion holes 120 respectively, the probe pins 200 may be positioned in the penetration section 310.

The second guide plate 100b functions to guide the plurality of probe pins 200 by the plurality of second pin insertion holes formed in the second guide plate 100b.

The second guide plate 100b is installed at a lower part of the support parts 300 and is positioned under the first guide plate 100a.

The first guide plate 100a and the second guide plate 100b are arranged to be vertically spaced apart from each other.

The plurality of second pin insertion holes are formed in the second guide plate 100b by being formed through the upper surface and the lower surface thereof.

A second end of each of the plurality of probe pins 200 is inserted into each of the plurality of second pin insertion holes.

Accordingly, the number of the plurality of second pin insertion holes is the same as the number of the plurality of probe pins 200 or the number of the plurality of first pin insertion holes.

When the first and second guide plates 100a and 100b and the support parts 300 are combined with each other, the plurality of second pin insertion holes are formed in the second guide plate 100b to be positioned in the area corresponding to the penetration section 310 of the support parts 300.

Accordingly, when the first end and the second end of each of the probe pins 200 are inserted into the first and second pin insertion holes 120 respectively, the probe pin 200 may be positioned in the penetration section 310.

Preferably, a size of the plurality of first or second pin insertion holes formed in each of the first and second guide plates 100a and 100b is smaller than or the same as a size of the penetration section 310 of the support parts 300. This is because the plurality of probe pins 200 are preferably positioned in the penetration section 310.

As described above, the first and second guide plates 100a and 100b are composed of the anodized films 110 formed by removing the metal after anodizing the metal, and each of the plurality of first and second pin insertion holes may be formed by etching the anodized films 110 to have a width larger than the width of each of the pores formed during the anodizing, and the description thereof may be replaced with the above description.

In addition, the first and second guide plates 100a and 100b may be formed by vertically laminating the anodized films 110 in plural, and the description thereof may be replaced with the above description.

Each of the plurality of probe pins 200 is installed in the probe card 10, and the second end thereof contacts with each of the semiconductor terminals 810 of the semiconductor wafer 800, so that the semiconductor wafer 800 is electrically connected to the inspection equipment.

A first end of each of the plurality of probe pins 200 is inserted into each of the plurality of first pin insertion holes, and the second end of each of the plurality of probe pins 200 is inserted into each of the plurality of second pin insertion holes.

As described above, the first end of each of the plurality of probe pins 200 is inserted into each of the plurality of first pin insertion holes and the second end of each of the plurality of probe pins 200 is inserted into each of the plurality of second pin insertion holes, so the plurality of probe pins 200 can be efficiently guided by the first and second guide plates 100a and 100b.

Each of the probe pins 200 as an elastic body having an elastic force is configured to be a needle-type pin.

Generally, such a needle-type probe pin is called a cobra pin. Of course, the probe pin 200 may be configured to be a vertical blade pin as well as a cobra pin.

Elastic parts 210 may be provided at a middle part of the probe pins 200 by bending and generate the elastic force. Due to each of the elastic parts 210, the probe pins 200 have the elastic force.

When cobra pins are provided as the probe pins 200, each of the cobra pins has the elastic part 210 and a first end and a second end of the cobra pin are not in the same vertical line.

The elastic parts 210 of the plurality of probe pins 200 are positioned in the penetration section 310. Accordingly, the elastic force of the plurality of probe pins 200 can be efficiently exhibited.

When a first end of each of the plurality of probe pins 200 is inserted into each of the first pin insertion holes of the first guide plate 100a to be guided, the first end of each of the plurality of probe pins 200 protrudes to an upper part of the first guide plate 100a, and the protruding first end of each of the plurality of probe pins 200 is electrically connected to a transformer terminal 510 of the space transformer 500.

When the second end of each of the plurality of probe pins 200 is inserted into each of the second pin insertion holes of the second guide plate 100b and is guided, the second end of each of the plurality of probe pins 200 protrudes to a lower part of the second guide plate 100b, and the protruding second end of each of the plurality of probe pins 200 contacts with the semiconductor terminals of the semiconductor wafer 800. Accordingly, the semiconductor wafer 800 (or the semiconductor device) can be electrically connected to the inspection equipment 700.

The support parts 300 are placed between the first and second guide plates 100a and 100b, and the penetration section 310 is provided by being formed through the upper surface and the lower surface thereof.

The first guide plate 100a is positioned at the upper part of the support parts 300, and the second guide plate 100b is positioned at the lower part of the support parts 300.

Accordingly, the support parts 300 allow the first and second guide plates 100a and 100b to be vertically spaced apart from each other and function to support the first and second guide plates 100a and 100b.

The penetration section 310 is defined in a middle of the support parts 300, and the plurality of probe pins 200 are positioned in the penetration section 310.

As described above, since the plurality of probe pins 200 are required to be positioned in the penetration section 310, the plurality of first pin insertion holes of the first guide plate 100a are positioned at the upper part of the penetration section 310 and the plurality of second pin insertion holes are positioned at the lower part of the penetration section 310.

As for the first guide plate 100a, the second guide plate 100b, and the support parts 300, which are described above, the first guide plate 100a, the support parts 300, and the second guide plate 100b are sequentially and vertically combined with each other in a direction of a lower part of the probe card 10 from an upper part thereof.

The penetration section 310 is preferably formed in the middle of the support parts 300.

Due to the support parts 300 and the penetration section 310, the first and second guide plates 100a and 100b can be maintained to be vertically spaced apart from each other, and the space vertically defined between the first and second guide plates 100a and 100b may become the penetration section 310.

Preferably, the size of the penetration section 310 is larger than or the same as the size of the plurality of first or second pin insertion holes formed in each of the first and second guide plates 100a and 100b. This is because the plurality of probe pins 200 are preferably positioned in the penetration section 310.

Such a vertical combination of the first guide plate 100a, the support parts 300, and the second guide plate 100b is performed by combination pins 400.

Combination pin holes (not shown) to which the combination pins 400 are inserted to be mounted may be formed in the first guide plate 100a, the support parts 300, the second guide plate 100b. In this case, the combination pin holes are provided at positions corresponding to the first guide plate 100a, the support parts 300, and the second guide plate 100b during the vertical combination thereof, wherein the combination pin holes are formed at positions at which the penetration section 310 and the first and second pin insertion holes are not formed.

The combination pins 400 may have various shapes, but may be bolts having helical protrusions or bolts combined with nuts.

Unlike the above description, the support parts 300 may not positioned between the first and second guide plates 100a and 100b, but be connected to the first and second guide plates 100a and 100b at side surfaces thereof, with the space maintained between the first and second guide plates 100a and 100b such that the first and second guide plates 100a and 100b are vertically spaced apart from each other.

In this case, middle parts of the plurality of probe pins 200, that is, the elastic parts 210 of the probe pins 200 are arranged in the space.

The space transformer 500 is positioned at an upper part of the probe card 10 and functions to electrically connect the probe card 10 to the PCB board 600.

The transformer terminal 510 is provided in the space transformer 500.

The transformer terminal 510 is provided in plural to have the same number as the number of the plurality of probe pins 200.

Accordingly, the first end of each of the plurality of probe pins 200 is inserted into each of the first pin insertion holes of the first guide plate 100*a* to be guided and is electrically connected to each of the plurality of transformer terminals 510.

The space transformer 500 functions to compensate for difference between the pitch of the plurality of probe pins 200 and the pitch of board terminals 610 of the PCB board 600.

Hereinbelow, a method of inspecting the semiconductor wafer 800 by using the probe pins 200 electrically connected to the inspection equipment 700 will be described referring to FIG. 6.

The PCB board 600 is provided between the inspection equipment 700 and the probe card 10 and functions to electrically connect the probe card 10 to the inspection equipment 700.

A plurality of board terminals 610 are provided in the PCB board 600, and the number of the plurality of board terminals 610 is provided to be the same as the number of the plurality of probe pins 200 or the number of the plurality of transformer terminals 510.

Accordingly, the first end of each of the plurality of probe pins 200 is electrically connected to the inspection equipment 700 by the PCB board 600 and the space transformer 500.

As illustrated in FIG. 6, the second end of each of the plurality of probe pins 200 contacts with each of the plurality of semiconductor terminals 810 of the semiconductor wafer 800 supported by a wafer support 900.

In this case, the number of the plurality of probe pins 200 is the same as the number of the plurality of semiconductor terminals 810.

When the second end of each of the plurality of probe pins 200 contacts with the plurality of semiconductor terminals 810, each of the semiconductor terminals 810 is electrically connected to the second end of each of the plurality of probe pins 200, so that electrical signals from the inspection equipment are transmitted to the semiconductor wafer 800. Accordingly, the semiconductor wafer 800 can be inspected for defects.

The probe card 10 according to the first embodiment of the present invention, which is described above, has the following effects.

Since the first and second pin insertion holes of the first and second guide plates 100*a* and 100*b* of the probe card 10 are formed by etching, the first and second pin insertion holes are formed through the upper parts and the lower parts of the first and second guide plates 100*a* and 100*b* without inclinations. Accordingly, although the second end of each of the plurality of probe pins 200 contacts with the semiconductor terminals 810, the probe card of the present invention has less shaking than the probe card having the conventional ceramic guide plate. Accordingly, the second end of each of the probe pins 200 can be effectively prevented from contacting with each of the semiconductor terminals 810 which is not targeted instead of each of the semiconductor terminals 810 which is targeted due to the shaking. Accordingly, high reliability of the probe card 10 is guaranteed.

Since the first and second pin insertion holes of the first and second guide plates 100*a* and 100*b* of the probe card are formed by etching, the guide plate of the present invention can more efficiently achieve miniaturization and precise arrangement of the first and second pin insertion holes compared to the conventional guide plate. Accordingly, the highly integrated semiconductor device (or the semiconductor wafer) can be effectively inspected.

The probe card 10 having the above-described configuration can have anodized films formed by removing a metal after anodizing the metal of only one guide plate of the first and second guide plates 100*a* and 100*b*.

In this case, each of the plurality of first or second pin insertion holes of the guide plate can be formed by etching the anodized films 110 to have a width larger than the width of each of the pores formed during the anodizing.

As described above, although only one guide plate of the first and second guide plates 100*a* and 100*b* is composed of the anodized films 100, the pin insertion holes of the remaining guide plate can be identified by naked eye due to high transmittance of the guide plate during manufacturing of the probe card 10. Accordingly, the insertion of the probe pins 200 is easy.

In this case, preferably, the first end and the second end of each of the probe pins 200 are first inserted into each of the pin insertion holes (each of the first pin insertion holes or the second pin insertion holes) of the guide plate composed of the first and second guide plates 100*a* and 100*b*.

Although the exemplary embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A guide plate for a probe card guiding probe pins of the probe card, the guide plate comprising:
    anodized films formed by removing a metal after anodizing the metal, and
    a plurality of pin insertion holes formed through an upper surface and a lower surface of each of the anodized films such that the probe pins are inserted thereinto,
    wherein each of the plurality of pin insertion holes is formed by etching the anodized films to have a width larger than a width of each of pores formed during the anodizing.

2. The guide plate of claim 1, wherein the guide plate for a probe card is provided by laminating the anodized films in plural.

3. The guide plate of claim 2, wherein the plurality of anodized films are vertically bonded to each other by an adhesive film placed between the plurality of anodized films, wherein the adhesive film has through holes formed in areas corresponding to the plurality of pin insertion holes and bonds non-hole areas, which do not have the plurality of pin insertion holes in the plurality of anodized films, to each other.

4. A manufacturing method of a guide plate for a probe card guiding probe pins of the probe card, the method comprising:
    anodizing a metal which is a basic material;
    removing the basic material in which the metal is removed from the anodized metal to make anodized films; and
    etching the anodized films to form a plurality of pin insertion holes into which the probe pins are inserted, each of the pin insertion holes having a width larger than a width of each of pores formed during the anodizing and formed through an upper surface and a lower surface of each of the anodized films.

5. The method of claim 4, further comprising:
    laminating the plurality of anodized films by vertically laminating the anodized films in plural formed during the removing of the basic material after the etching and by placing an adhesive film between the plurality of anodized films to vertically bond the plurality of anodized films to each other, wherein the plurality of anodized films are bonded to each other by being arranged such that the plurality of pin insertion holes formed in each of the plurality of anodized films vertically correspond to each other; and removing the adhesive film by laser irradiation on the plurality of pin insertion holes of the plurality of anodized films laminated vertically.

6. The method of claim 4, further comprising:

laminating the anodized films by bonding non-hole areas without the plurality of pin insertion holes in the plurality of anodized films to each other by an adhesive film in such a manner that the anodized films formed in the removing of the basic material after the etching are vertically laminated in plural, and the plurality of anodized films are vertically bonded to each other by placing the adhesive film between the plurality of anodized films, wherein the plurality of anodized films are laminated by being arranged such that the plurality of pin insertion holes formed in each of the plurality of anodized films vertically correspond to each other, and the adhesive film has through holes in areas corresponding to the plurality of pin insertion holes.

7. A probe card comprising:

a first guide plate having a plurality of first pin insertion holes formed through an upper surface and a lower surface thereof;

a second guide plate positioned under the first guide plate to be vertically spaced apart therefrom and having a plurality of second pin insertion holes formed through an upper surface and a lower surface thereof; and a plurality of probe pins, a first end of each of which is inserted into each of the plurality of first pin insertion holes to be guided, and a second end of each of which is inserted into each of the plurality of second pin insertion holes to be guided, wherein at least one guide plate of the first and second guide plates is composed of anodized films formed by removing a metal after anodizing the metal, and each of the plurality of first pin insertion holes or second pin insertion holes of the any one guide plate is provided by etching each of the anodized films to have a width larger than a width of each of pores formed during the anodizing.

8. The probe card of claim 7, wherein the one guide plate is provided by laminating the anodized film in plural.

9. The probe card of claim 7, further comprising:

support parts placed between the first and second guide plates and having a penetration section defined between the support parts, wherein a size of the plurality of first or second pin insertion holes formed in each of the first and second guide plates is smaller than or the same as a size of the penetration section, and elastic parts of the probe pins are positioned in the penetration section.

* * * * *